US010305251B2

(12) United States Patent  
Liang et al.

(10) Patent No.: US 10,305,251 B2  
(45) Date of Patent: May 28, 2019

(54) LASER DIODES WITH LAYER OF GRAPHENE

(71) Applicant: HEWLETT PACKARD ENTERPRISE DEVELOPMENT LP, Houston, TX (US)

(72) Inventors: Di Liang, Palo Alto, CA (US); Yingtao Hu, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/151,647

(22) Filed: May 11, 2016

(65) Prior Publication Data

US 2017/0331249 A1 Nov. 16, 2017

(51) Int. Cl.
```
H01S 5/026   (2006.01)
H01S 5/00    (2006.01)
H01S 5/10    (2006.01)
H01S 5/02    (2006.01)
H01S 5/06    (2006.01)
```

(52) U.S. Cl.  
CPC .......... H01S 5/0265 (2013.01); H01S 5/0085 (2013.01); H01S 5/026 (2013.01); H01S 5/1032 (2013.01); H01S 5/021 (2013.01); H01S 5/0607 (2013.01); H01S 5/1071 (2013.01)

(58) Field of Classification Search  
CPC .... H01S 5/0265; H01S 5/0085; H01S 5/0625; H01S 5/06251; H01S 5/06253; H01S 5/18302  
See application file for complete search history.

(56) References Cited

U.S. PATENT DOCUMENTS

| | | | | |
|---|---|---|---|---|
| 5,301,201 A | * | 4/1994 | Dutta | G02F 1/29 372/101 |
| 9,042,683 B2 | | 5/2015 | Cho et al. | |
| 2002/0179929 A1 | * | 12/2002 | Takahashi | B82Y 20/00 257/184 |
| 2006/0054899 A1 | * | 3/2006 | Takahashi | B82Y 20/00 257/80 |
| 2011/0026108 A1 | * | 2/2011 | Takahashi | B82Y 20/00 359/344 |
| 2013/0188664 A1 | | 7/2013 | Xie et al. | |
| 2014/0056551 A1 | | 2/2014 | Liu et al. | |

(Continued)

FOREIGN PATENT DOCUMENTS

| | | |
|---|---|---|
| CN | 104319613 A | 1/2015 |
| CN | 104538839 A | 4/2015 |

OTHER PUBLICATIONS

Shastri et al. ("Dynamical laser spike processing", arXiv, physics. optics, Jul. 24, 2015).*

(Continued)

*Primary Examiner* — Tod T Van Roy  
(74) *Attorney, Agent, or Firm* — McDermott Will & Emery

(57) ABSTRACT

According to an example of the present disclosure a semiconductor laser diode includes a layer of graphene between an active laser region and a semiconductor substrate structure. The semiconductor laser diode may further include a first pair of electrodes to apply a potential difference across the active laser region and a second pair of electrodes to apply a potential difference across the layer of graphene.

15 Claims, 9 Drawing Sheets

(56) References Cited

U.S. PATENT DOCUMENTS

| | | | | |
|---|---|---|---|---|
| 2014/0314109 | A1* | 10/2014 | Liang | H01S 5/0261 |
| | | | | 372/26 |
| 2015/0194789 | A1* | 7/2015 | Graham | H01S 5/183 |
| | | | | 372/38.05 |
| 2016/0161675 | A1* | 6/2016 | Englund | B82Y 20/00 |
| | | | | 250/206 |
| 2017/0047708 | A1* | 2/2017 | Johnson | H01S 5/18302 |

OTHER PUBLICATIONS

Kim, Y-H. et al., "Graphene-contact Electrically Driven Microdisk Lasers," (Research Paper), Nature Communications, Oct. 9, 2012, 10 pages, available at http://www.nature.com/ncomms/journal/v3/n10/full/ncomms2137.html.

Li, X. et al., "Graphene/h-BN/GaAs Sandwich Diode as Solar Cell and Photodetector," (Research Paper), Optics Express 24.1, 2016, pp. 134-145, available at https://www.osapublishing.org/oe/fulltext.cfm?uri=oe-24-1-134.

\* cited by examiner

LASER DIODES WITH LAYER OF GRAPHENE

STATEMENT OF GOVERNMENT INTEREST

This invention was made with government support under Contract No. H98230-12-C-0236, awarded by Maryland Procurement Office. The government has certain rights in the invention.

BACKGROUND

A laser diode includes a semiconductor laser with an active laser region. The active laser region may be electrically pumped by applying a potential difference across the active laser region. One known method of modulating the output power of a laser diode is to vary the injection current or bias voltage that is used to pump the active laser region.

BRIEF DESCRIPTION OF THE DRAWINGS

Examples of the disclosure will now be described, by way of non-limiting example only, with reference to the accompanying drawings, in which.

DETAILED DESCRIPTION

Figure 1:
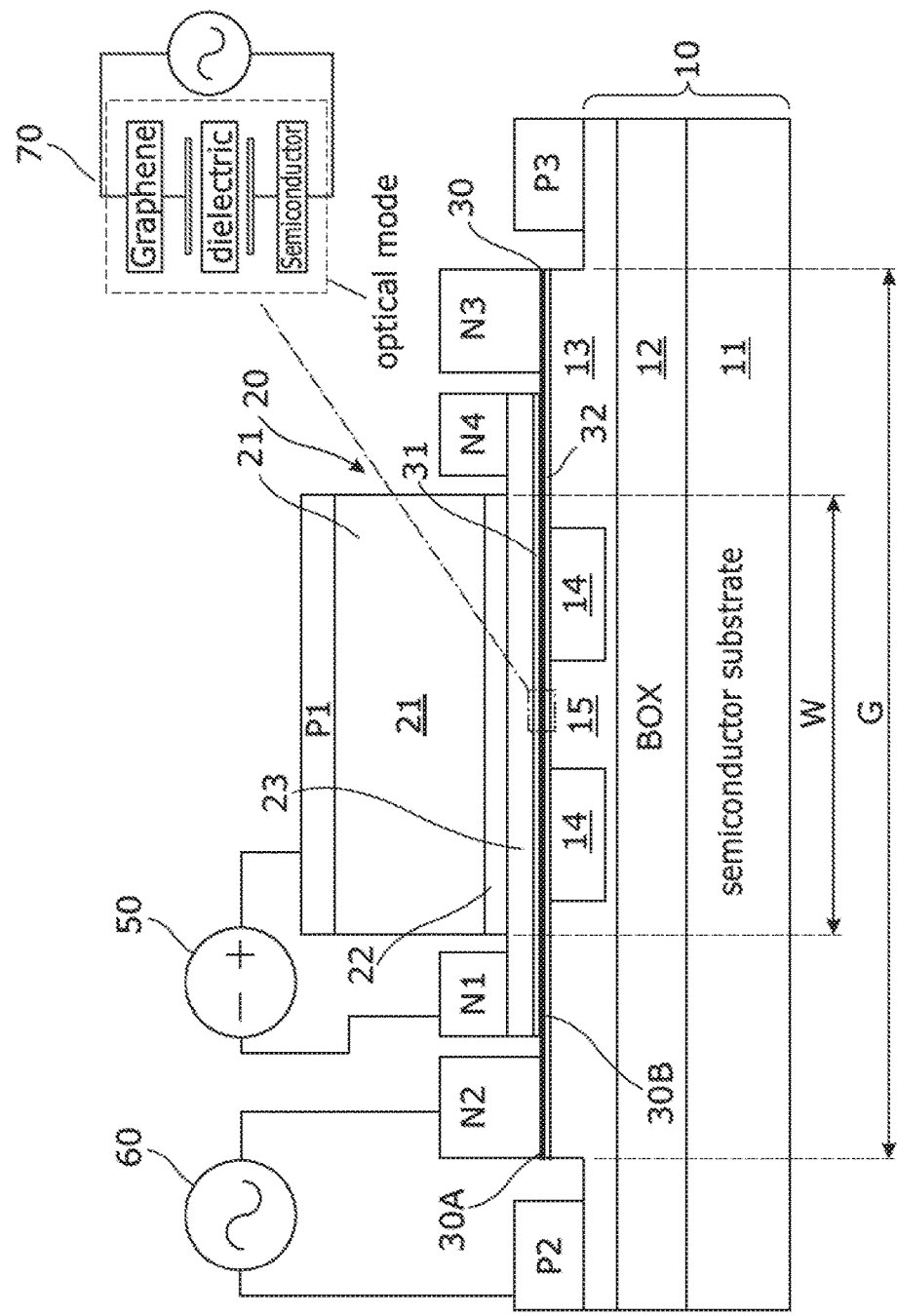
FIG. 1 shows an example of a laser diode according to the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the term "includes" means includes but not limited to, the term "including" means including but not limited to. The term "based on" means based at least in part on. The term "number" means any natural number equal to or greater than one. In addition, the terms "a" and "an" are intended to denote at least one of a particular element.

A laser diode includes an active laser region. A voltage may be applied across the active laser region in order to inject a current and pump the active laser region. This causes stimulated emission of coherent light. The output power of the laser diode may be modulated by varying the injection current or bias voltage that is used to pump the active laser region.

However, in the above method the modulation bandwidth is proportional to laser output power. Therefore, this approach requires a very large injection current for high-speed modulation and can cause high power consumption, overheating etc. Furthermore, varying the injection current changes the lasing wavelength which leads to chirp (different laser wavelength at high and low power points). This may limit channel spacing when using modulated lasers in WDM applications and risks cross talk between channels. Another approach, instead of modulating the output laser power directly, is to use a separate optical modulator, such as a semiconductor modulator, downstream of the laser.

The present disclosure proposes including a layer of graphene in the semiconductor diode in order to modulate the output laser power. For example, the layer of graphene may be between the active laser region and a semiconductor substrate structure. The semiconductor laser diode may further include a first pair of electrodes to apply a potential difference across the active laser region and a second pair of electrodes to apply a potential difference across the layer of graphene.

In this way the optical absorption of the graphene layer and thus absorption in the optical cavity of the laser diode can be varied by varying the potential difference applied to the layer of graphene. Even very thin layers of graphene have excellent optical absorption characteristics. Therefore, a thin layer of graphene may be integrated directly into the laser diode structure, rather than using a separate optical modulator. The optical characteristics of graphene are very responsive to changes in the voltage and so this structure may provide quick modulation of the output laser power. Further, as this approach does not change the frequency of the light, it may modulate the laser output without causing chirp.

FIG. 1 shows a semiconductor laser diode according to one example of the present disclosure. The semiconductor laser diode includes a semiconductor laser structure 20 including an active laser region mounted on a semiconductor substrate structure 10, and a layer of graphene 30 between the semiconductor substrate structure 10 and the semiconductor laser structure 20.

The laser diode includes an optical cavity, or laser cavity, which is a region through which the laser light is reflected back and forth or circulates around. For example, the light may be reflected back and forth by reflectors at either end of the optical cavity in the case of a straight laser structure, or may travel continuously around the cavity in the case of a ring structure laser etc. FIG. 1 is a cross section of a straight laser structure in which the optical cavity extends out of the page. The laser cavity includes the active laser region and light is amplified as it passes through the active laser region. The graphene layer may form part of the optical cavity of the laser, i.e. an optical mode of the laser cavity may overlap with the graphene layer.

As the optical cavity of the laser diode overlaps both the active laser region and the graphene, by varying a voltage bias applied to the graphene layer, the output of the laser diode may be modulated even when a bias voltage applied to the active laser region is kept constant.

The semiconductor substrate structure 10 may include a waveguide. An optical mode of the waveguide may overlap with the active laser region and the graphene layer. Thus laser light may be coupled from the laser cavity into a waveguide of the semiconductor substrate 10. In one example, the waveguide 15 is formed by a core region of the semiconductor substrate. The core region 15 may have a higher refractive index than regions on either side of the core. The regions on either side of the core may for example be an air interface, another type of semiconductor or an oxide. In the example shown in FIG. 1, the regions 14 on either side of the core are an oxide. Thus the semiconductor substrate structure 10 in the example of FIG. 1 is a semiconductor on oxide structure (SOI).

The SOI 10 may include at least a semiconductor layer and an oxide layer. The oxide layer may be a buried oxide layer, meaning the oxide layer is surrounded by the semiconductor. In the illustrated example the SOI includes a buried oxide layer 12, between a semiconductor substrate 11 and a further semiconductor layer 13. Oxide regions 14 are inserted within the semiconductor layer 13 on either side of a core 15 which forms a semiconductor waveguide.

In general the semiconductor substrate structure 10 provides a waveguide through which light from the active laser region can be directed out of the laser diode. The semiconductor substrate structure 10 may include any suitable semiconductor, for example Silicon, Germanium, Gallium Arsenide etc.

The active laser region is a region which is a source of the optical gain within the laser. The active laser region comprises semiconductor materials. In some examples the semiconductor laser structure 20, including the active laser region, is a III-V structure. A III-V structure is a laser structure formed from doped or un-doped semiconductor materials taken from group III to group V of the periodic table. In other examples, some or all of the semiconductors for the laser structure may be taken from elsewhere on the periodic table, for instance group II-VI compound semiconductors.

In some examples, the semiconductor laser structure 20 including the active laser region is a heterostructure. A heterostructure is a structure including a plurality of semiconductor layers. At least some of the layers may have different materials, or the same material but different doping to the adjacent layers.

In the illustrated example, shown in FIG. 1, the heterostructure 20 includes an intrinsic semiconductor layer 22 between a positively doped semiconductor layer 21 and a negatively doped semiconductor layer 23. In one example, the layer 21 is a P-InP or positively doped Indium Phosphate layer and the layer 23 is a negatively N-InP or negatively doped Indium Phosphate layer. Examples of other possible materials for the semiconductor layers include, but are not limited to P-AlGaAs, N-(Al)GaAs, P-SiGe and N-SiGe. In other examples, the polarity of the doping of the first doped semiconductor layer 21 and second doped semiconductor layer 23 may be reversed.

In general, the junctions between the different layers of the heterostructure are referred to as heterojunctions. The active laser region may be formed by a heterojunction or a plurality of heterojunctions. In the example of FIG. 1, the intrinsic semiconductor layer 22 acts as a quantum layer, for instance a quantum well, multiple quantum well, quantum dash or quantum dot layer. The first di-electric layer 31 is between the upper face 30A of the graphene layer and the second doped semiconductor layer 23. The first di-electric layer in the arrangement of FIG. 1, thus insulates the second doped semiconductor layer 23 from the graphene layer 30. The second di-electric layer 32 is between the bottom face 30B of the graphene layer and an upper semiconductor layer 13 of the SOI structure. The second di-electric layer 32 between the graphene layer 30 and the semiconductor layer 13 effectively forms a capacitor between the third electrode N2 and the fourth electrode P2 as schematically shown in the circuit diagram 70 to the right of FIG. 1. This enables a bias voltage to be applied across the graphene layer 30 so as to adjust the optical absorption of the graphene layer.

In the example of FIG. 1 the active laser region has a lateral extent, or width W, which may be approximately equal to a width or lateral extent of the quantum well 22 or the first doped semiconductor 21. The graphene layer meanwhile has a lateral extent, or width G, which is greater than the width of the active laser region. This helps to ensure that any laser light from the active laser region has to pass through the graphene layer 30 before entering the SOI 10.

The graphene layer 30, the graphene layer may extend through the optical mode of the laser diode. In one example the graphene layer extends through the center of the optical mode. In one example active laser region is adjacent a waveguide region 15 of the SOI and the waveguide is separated from the active laser region by the graphene layer 30. In one example, the graphene layer 30 is continuous so there is no gap through which the laser light can enter the waveguide 15 without passing through the graphene.

In one example, the graphene layer 30 extends continuously in a lateral direction from at least a first side of the laser structure 20 (left in FIG. 1) to a second side of the laser structure (right in FIG. 1). The third P2 and fourth N2 electrodes are both on the first side of the laser structure 20. Meanwhile, a third pair of electrodes including fifth electrode N3 and sixth electrode P3 are on a second side of the laser structure. Although not explicitly shown in FIG. 1, the fifth electrode N3 may connected to the same voltage source 60 and be held at the same potential as the third electrode N2. The sixth electrode P3 may connected to the same voltage source 60 and be held at the same potential as the fourth electrode P2. In this way the potential difference may be applied relatively evenly between the first and second faces 30A, 30B of the graphene layer along its width G. A seventh electrode N4 may be located on a part of the second doped semiconductor layer 23 which extends outwardly to the right side of the heterostructure 20. Although not explicitly shown in FIG. 1 the first electrode P1 and the seventh electrode N4 may be connected to the voltage source 50 so as to apply the pump voltage to the active laser region.

Figure 2:
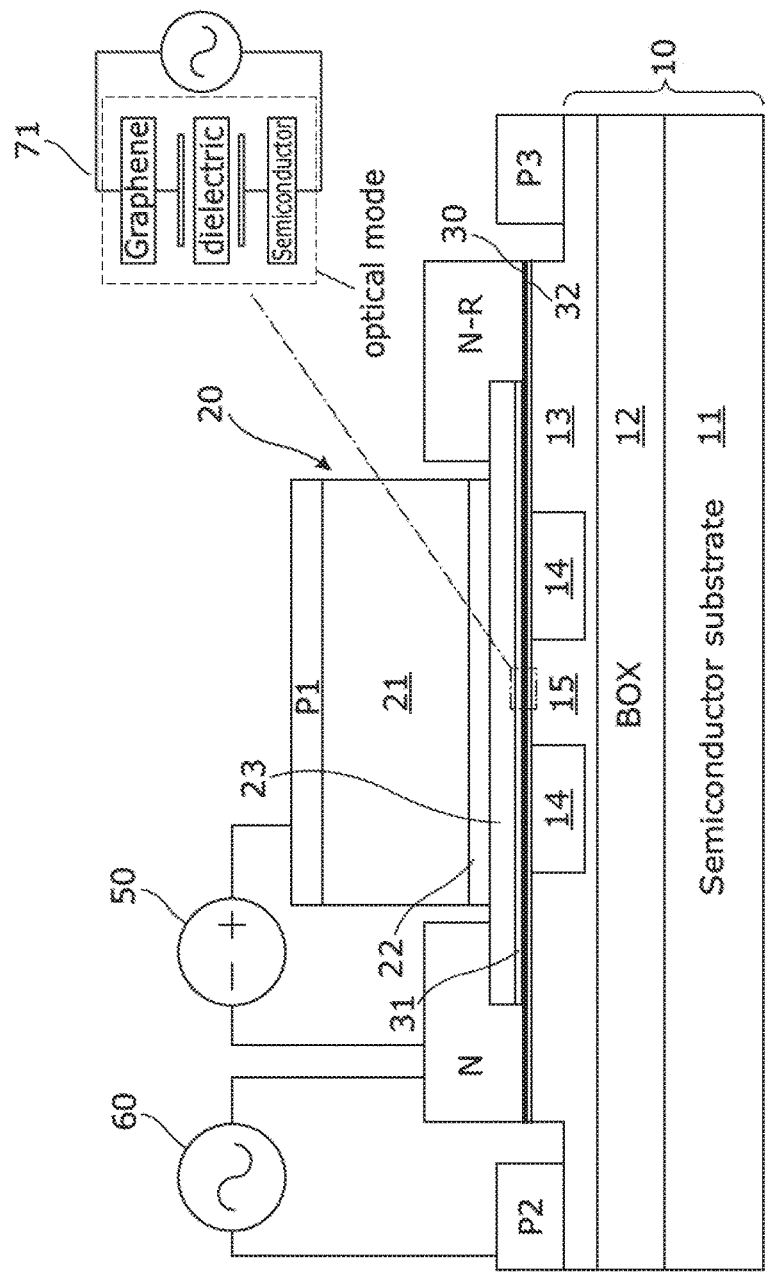
FIG. 2 shows another example of a laser diode according to the present disclosure.

FIG. 2 is another example of a laser diode which is similar to FIG. 1 and in which like reference numerals denote like parts. The difference between FIG. 1 and FIG. 2 is that in the example of FIG. 2, the first electrode pair and second electrode pair share a common electrode N. Thus, instead of having two separate electrodes N1, N2, in FIG. 2 a single electrode N acts as an electrode for both the laser pump 50 and the voltage bias 60 to be applied to the graphene layer 30. There may be two such single electrodes acting as common electrodes of the laser pump and graphene bias, one common electrode N on a first side of the active laser region (left in FIG. 2) and another common electrode N-R on a right side of the active laser region (right in FIG. 2).

Compared to FIG. 1, the arrangement of FIG. 2 is more compact. It may also have lower resistance. On the other hand, the arrangement of FIG. 1 with separate electrodes for the laser pump and graphene bias, allows more independence in the control of laser pump and the modulation of light via the graphene bias.

Figure 3:
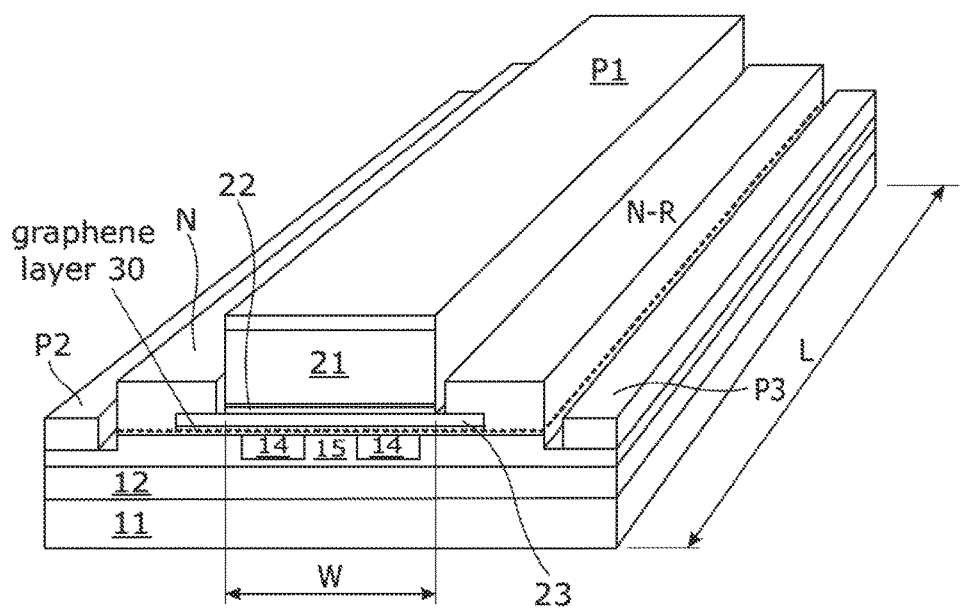
FIG. 3 is a perspective diagram showing an example of the laser diode of FIG. 2 in which the graphene layer extends along the entire length of the active laser region.

FIG. 3 is a perspective diagram showing the arrangement of FIG. 2 in three dimensions. In the example of FIG. 3, the laser diode has a straight design. A length of the laser diode L extends in the direction which is into the paper in FIG. 2. In the example of FIG. 3, the graphene layer 30 extends throughout the length of the laser diode.

Figure 4:
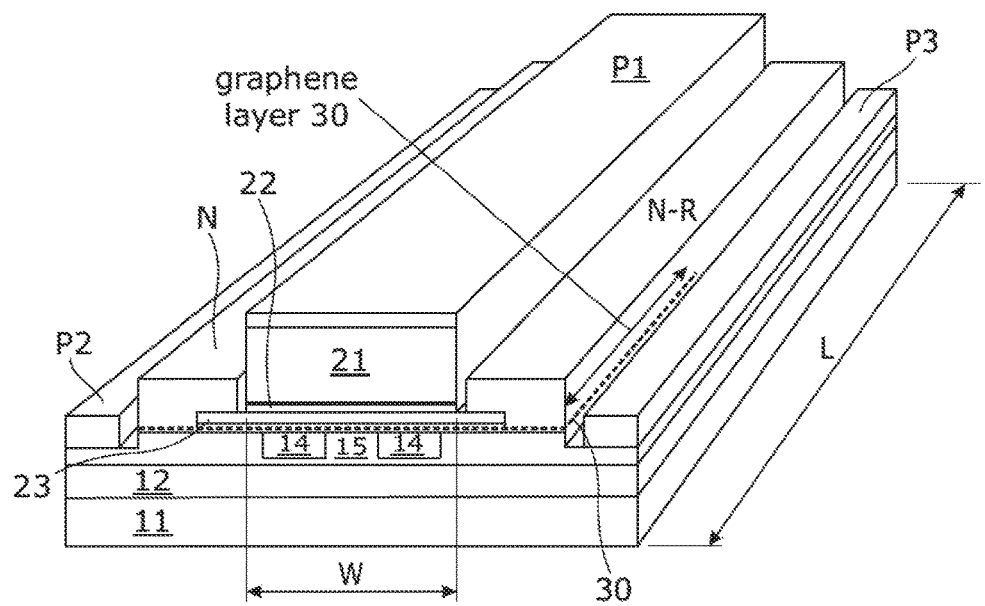
FIG. 4 is a perspective diagram showing an example of the laser diode of FIG. 2 in which the graphene layer extends along part of the length of the active laser region.

FIG. 4 is a perspective diagram of another example arrangement based on FIG. 2 in three dimensions. The example of FIG. 4 is the same as FIG. 3, except that the graphene layer 30 extends just a part of the way through the length of the laser diode and not the whole length. However, it still extends continuously in a lateral direction across the entire width W of the active laser region. It also extends continuously from one side to another of an optical mode through which light may travel from the active laser region to a waveguide 15 of the SOI structure.

Although not shown, the arrangement of FIGS. 1 and 2, and also FIGS. 5 to 7 described below, will have a similar three dimensional arrangement to that shown in FIG. 3 or 4. Further, FIGS. 3 and 4 are just two examples and the teaching of the present disclosure may be applied to other shapes of laser diode.

Figure 5:
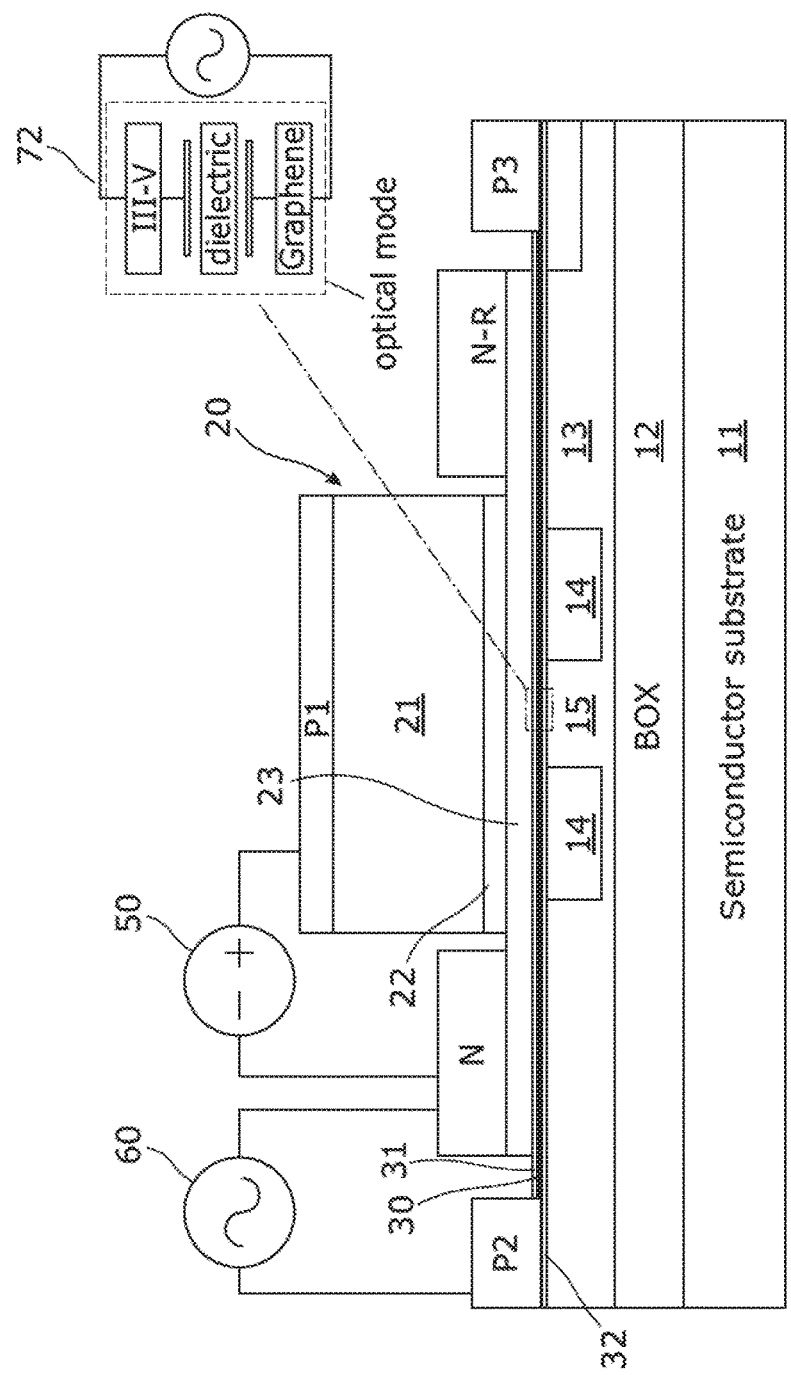
FIG. 5 shows another example of a laser diode according to the present disclosure.

FIG. 5 is similar to FIG. 2, and like reference numerals denote like parts. However, the second electrode N and corresponding fourth electrode N-R on the other side of the active region, are in direct contact with second doped semiconductor layer 23, but not in direct contact with the graphene layer 30. Meanwhile, the third electrode P2 and corresponding fifth electrode P3 on the right side of the active laser region are in contact with the graphene layer 30. The result is to provide an effective capacitive arrangement between the second and third electrode (and fourth and fifth electrode) as shown in the circuit diagram 71 to the right of the Figure.

Figure 6:
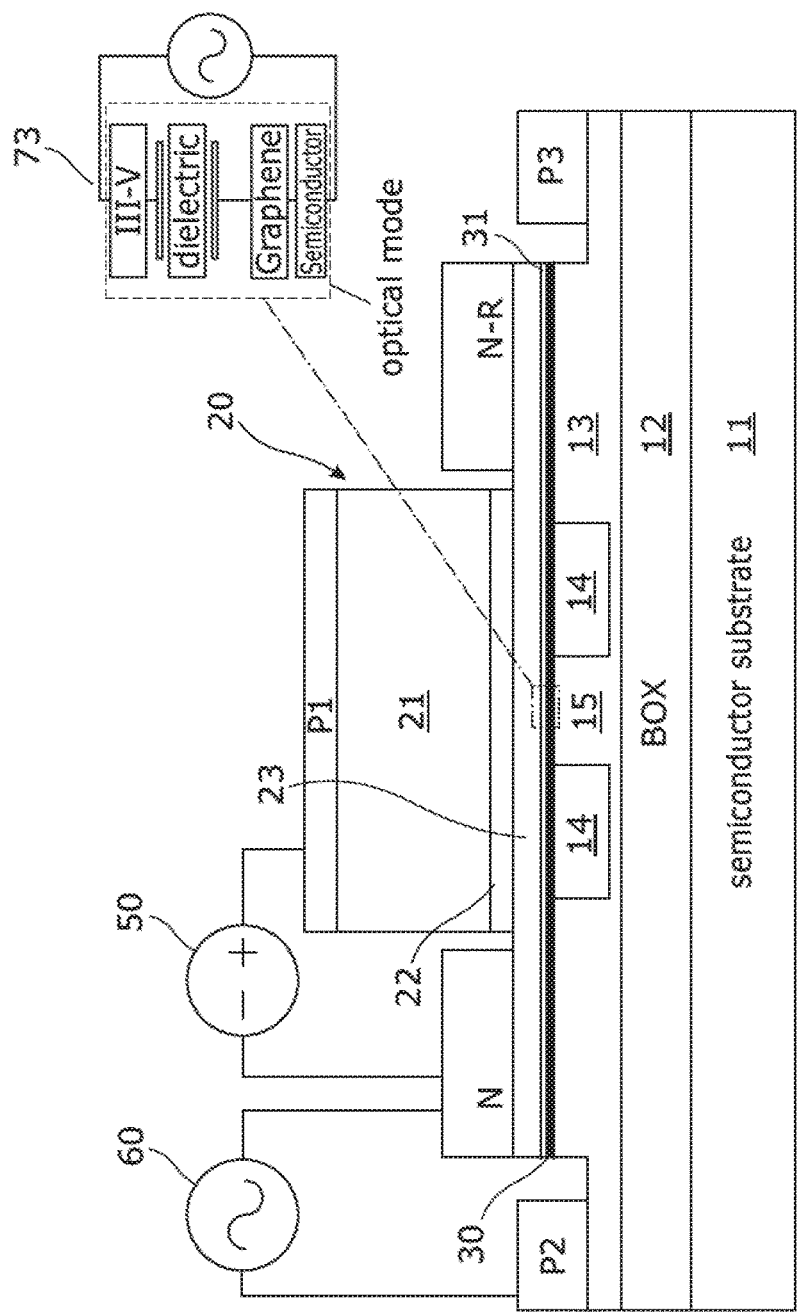
FIG. 6 shows another example of a laser diode according to the present disclosure.

FIG. 6 is similar to FIG. 2, except that the second electrode N and the corresponding fourth electrode N-R are in contact with the second doped semiconductor layer 23, but not with the graphene layer 30. Further, the graphene layer 30 is in electrically conductive contact with an upper semiconductor layer 13 of the SOI. Thus, there is one insulating di-electric layer 31 in FIG. 6, rather than two insulating di-electric layers sandwiching the graphene layer 30 as in FIG. 2. The result is to provide an effective capacitive arrangement between the second electrode N and third electrode P2 (and fourth electrode N-R and fifth electrode P3) as shown in the circuit diagram 72 to the right of FIG. 6.

Figure 7:
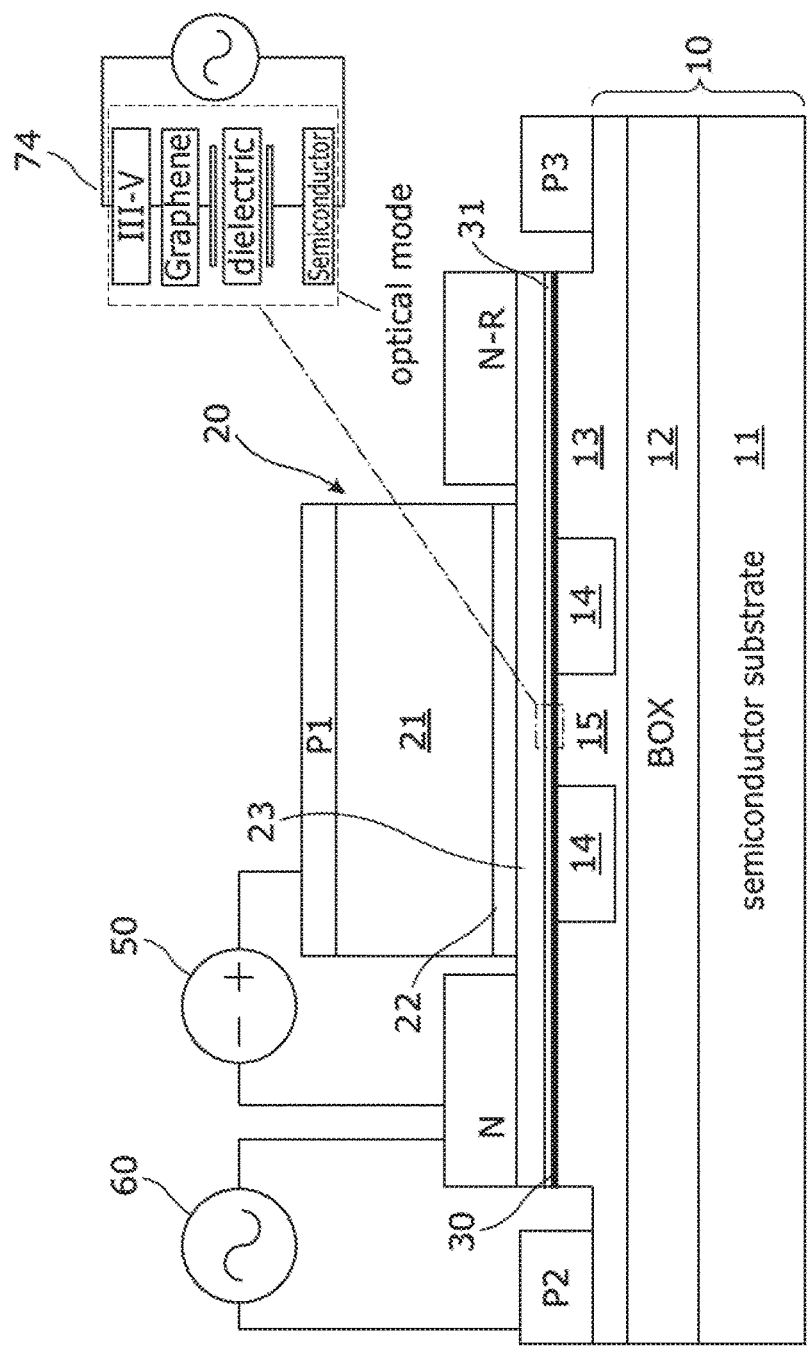
FIG. 7 shows another example of a laser diode according to the present disclosure.

FIG. 7 is similar to FIG. 6 with one insulating di-electric layer, except that the insulating di-electric layer 32 is between the graphene layer 30 and the upper semiconductor layer 13 of the SOI, rather than between the second semiconductor layer 23 of the heterostructure and the graphene layer. Thus, in this example the second semiconductor layer 23 is in electrically conductive contact with the graphene layer. The result is to provide an effective capacitive arrangement between the second and third electrode (and fourth and fifth electrode) as shown in the circuit diagram 73 to the right of the Figure.

Figure 8:
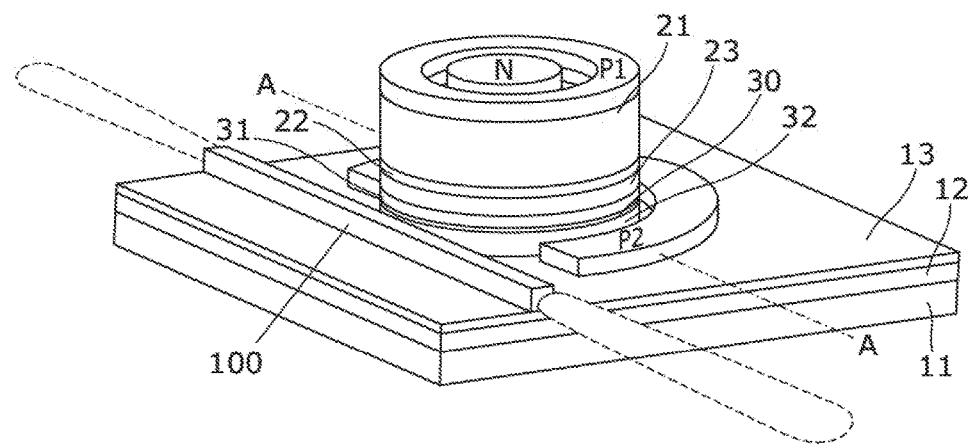
FIG. 8 is a perspective diagram showing another example laser diode according to the present disclosure, in which example the laser diode has a ring structure.

FIG. 8 is a perspective diagram showing another example in which the laser diode has a ring structure, rather than a straight Fabry-Perot structure. The basic structure and principle of operation is similar and like reference numerals denote like parts to the previous diagrams. As can be seen in the diagram, the first electrode P1 is on top of the ring structure, the second electrode N is inside the ring structure and the third electrode P2 extends is outside of the ring structure. The electrical connections to the layers may be the same as in FIG. 2. E.g. the first electrode P1 contacts the first doped semiconductor layer 21 which is part of the ring, the second electrode N contacts the second doped semiconductor layer 23 which is inside the ring and the graphene layer which extends through the ring, and the third electrode P2 contacts a semiconductor layer 13 of the SOI on which the ring shaped heterostructure is mounted. The arrangements of FIGS. 1 and 5-7 may also be implemented in a ring structure.

Figure 9:
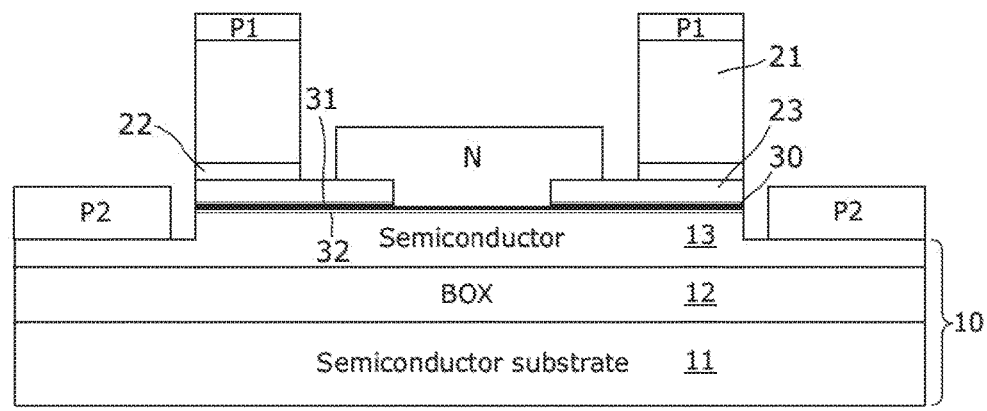
FIG. 9 is a cross-section along the line A-A of FIG. 8.

Laser light may exit the laser diode through a semiconductor layer of the semiconductor substrate to an external waveguide 100 as shown in FIG. 8. FIG. 9 is a cross sectional diagram showing a cross section of FIG. 8 along the line A-A. Like reference numerals indicate like parts as in FIG. 8.

The above described example laser diodes may be manufactured by any appropriate process. For example, by transferring the graphene layer 30 to the structure with the active laser region 20 or the semiconductor substrate structure 10 and then wafer bonding them together, or by depositing or growing graphene and the layers in the semiconductor laser structure 20 on semiconductor substrate structure 10 in a sequential manner.

Figure 10:
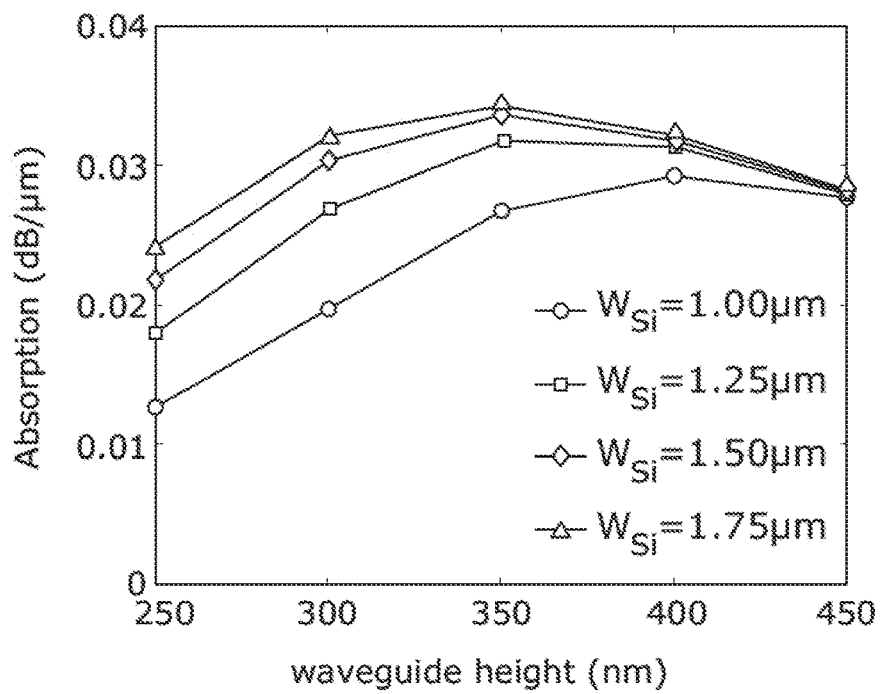
FIG. 10 is a graph showing simulated optical characteristics of an example laser diode according to the present disclosure.
Figure 11:
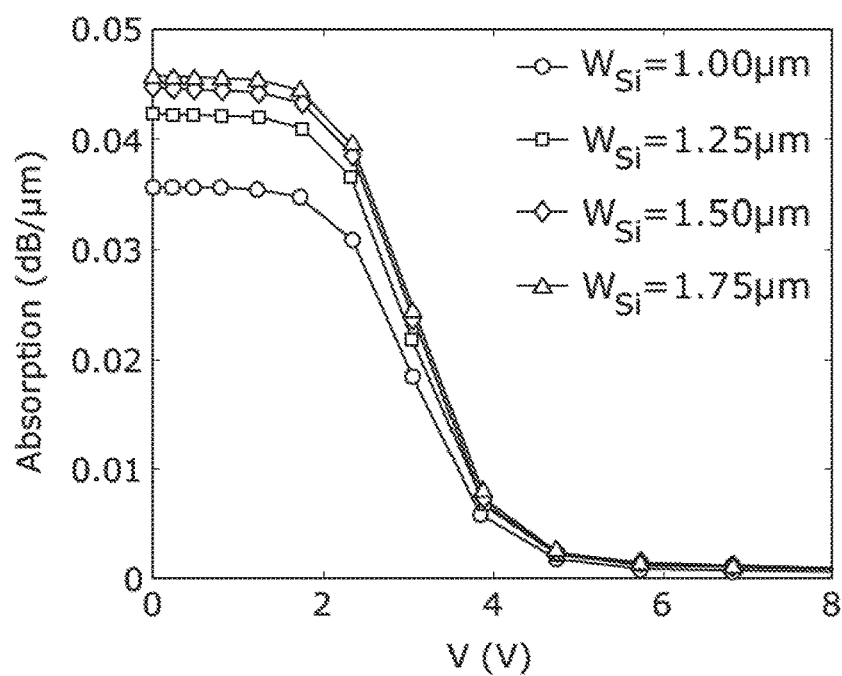
FIG. 11 is another graph showing simulated optical characteristics of an example laser diode according to the present disclosure.
Figure 12:
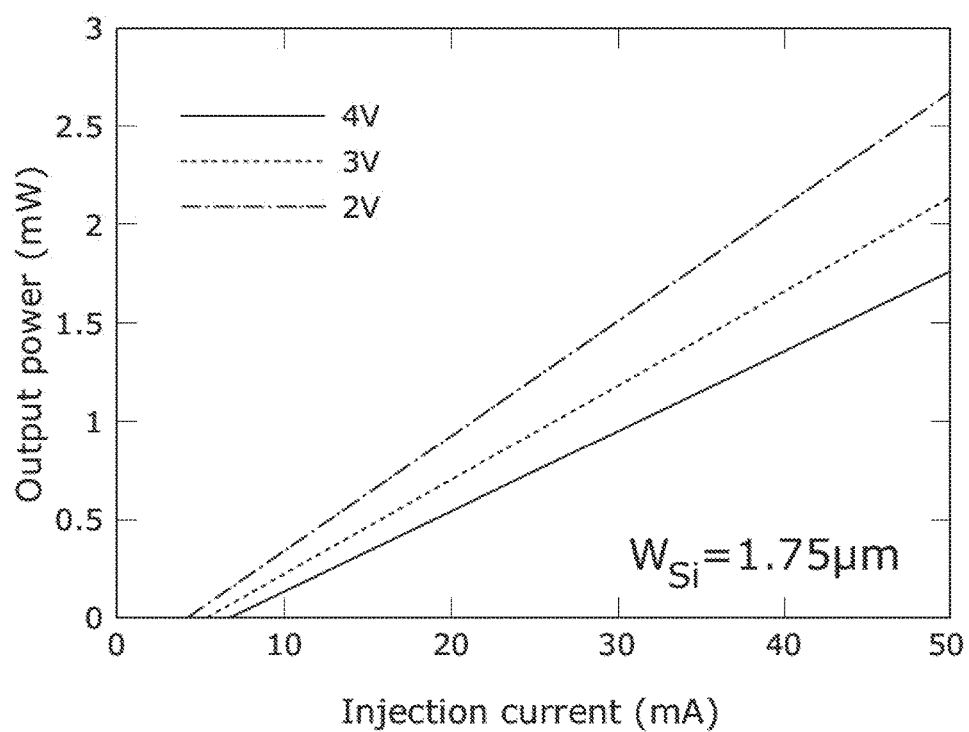
FIG. 12 is yet another graph showing simulated optical characteristics of an example laser diode according to the present disclosure.

FIGS. 10-12 are graphs showing the simulated optical absorption and light current characteristics of example laser diodes having the configuration shown in FIG. 2.

FIG. 10 shows the optical absorption by the graphene layer in dB/μm as a function of waveguide height according to a computer simulation. The simulation assumes a 5 nm thick $SiO_2$ layer as the di-electric layer 31. The results are shown for a plurality of example semiconductor diodes having waveguide widths of 1.00 μm, 1.25 μm, 1.50 μm and 1.75 μm respectively. The dimensions in width and height of the waveguide portion of the laser diode determine the optical mode profile and its overlap with the graphene. The optical absorption can be maximized when the overlap is strongest.

FIG. 11 shows the simulated optical absorption by the graphene layer in dB/μm as a function of bias voltage applied to the graphene layer. As for FIG. 10, the results are shown for a plurality of example semiconductor diodes having a plurality of different waveguide widths. As can be seen in the FIG. 11 the absorption is very responsive to variation in bias voltage and is minimized when the bias is low, e.g. below 2V. In this example, the absorption increases sharply between 2 and 4V. Thus the output from the laser diode can be effectively modulated by changing the bias voltage applied to the graphene layer between 2V and 4V. While a positive voltage bias is shown in FIG. 11, similar results may be obtained by applying a similar magnitude of negative voltage bias to the graphene layer.

FIG. 12 shows the simulated light-current (LI) characteristic for a 150 μm long laser diode having a waveguide width of 1.75 μm. Specifically, it shows the output laser power as a function of injection current when the bias voltage applied to the graphene layer is 2V, 3V and 4V respectively. It can be seen that at each injection current level, the output power could be modulated by changing the bias voltage applied to the graphene layer. This data was obtained by combining the graphene absorption loss from the simulation of FIG. 11 with in a simulation for a laser diode without the graphene layer. The simulation assumed a relatively large intrinsic cavity loss (without graphene absorption) of 20 $cm^{-1}$. For laser diodes with lower intrinsic cavity loss the graphene absorption effect would be even greater in relative terms as it would be a more dominant factor in the total cavity loss. There is little or no chirp associated with the optical modulation by the graphene layer as the injection current and thus wavelength of the laser may remain the same. Furthermore, as the optical absorption in the graphene layer occurs inside the laser cavity, the power consumption may be much lower than for designs which use an external optical modulator outside of the laser diode.

All of the features disclosed in this specification (including any accompanying claims, abstract and drawings), and/or all of the blocks of any method or process so disclosed, may be combined in any combination, except combinations where at least some of such features and/or blocks are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A laser diode comprising:
   a semiconductor laser structure including an active laser region;
   a semiconductor substrate;
   a layer of graphene between the semiconductor laser structure and the semiconductor substrate;
   a first pair of electrodes to apply a first potential difference across the active laser region; and
   a second pair of electrodes to apply a second potential difference across the layer of graphene, wherein:
   the first pair of electrodes and at least one electrode of the second pair of electrodes are disposed above the layer of graphene and the first pair of electrodes and the at least one electrode of the second pair of electrodes at least partially overlap a top surface of the layer of graphene, and
   at least one electrode of the second pair of electrodes is separate from the first pair of electrodes whereby the second potential difference applied to the graphene layer can be varied without varying the first potential difference across the active laser region; and wherein each electrode of the first and second pair of electrodes is on a same side of the semiconductor substrate.

2. The laser diode of claim 1 wherein the graphene layer extends continuously from a first side of the active laser region to a second side of the active laser region.

3. The laser diode of claim 1 wherein the first pair of electrodes and second pair of electrodes share an electrode in common.

4. The laser diode of claim 1 further comprising an insulating layer that together with the layer of graphene forms a capacitor between the second pair of electrodes.

5. The laser diode of claim 1 wherein the layer of graphene has a first face facing the semiconductor laser structure and a second face facing the semiconductor substrate and wherein the second pair of electrodes is to apply a potential difference between the first face and the second face of the layer of graphene.

6. The laser diode of claim 1 wherein the layer of graphene has a width equal to or greater than a width of the active laser region and a length extending along at least part of the length of the active laser region.

7. The laser diode of claim 1 wherein the active laser region is adjacent a waveguide of the semiconductor substrate and separated from the waveguide by the layer of graphene.

8. The laser diode of claim 1 wherein the first pair of electrodes is on a first side of the active laser region and a third pair of electrodes to apply a potential difference across the layer of graphene is located on a second side of the active laser region.

9. A laser diode comprising:
   a semiconductor substrate;
   an active laser region positioned over the semiconductor substrate, wherein the active laser region includes a first doped semiconductor layer, a second doped semiconductor layer having a doping which is opposite in polarity to a doping of the first doped semiconductor layer, and a quantum layer between the first and second doped semiconductor layers;
   a graphene layer and at least one insulating layer extending between the active laser region and the semiconductor substrate;
   a first pair of electrodes including a first electrode and a second electrode, the first electrode connecting with the first doped semiconductor layer of the active laser region, and the second electrode connecting with the second doped semiconductor layer of the active laser region; and
   a second pair of electrodes including a third electrode and a fourth electrode, the third electrode having an electrically conductive connection to the graphene layer, and the fourth electrode having an electrically conductive connection to the semiconductor substrate, whereby a capacitive path including the graphene layer and the at least one insulating layer is formed between the third electrode and the fourth electrode, wherein:
   the first pair of electrodes and at least one electrode of the second pair of electrodes are disposed above the layer of graphene and the first pair of electrodes and the at least one electrode of the second pair of electrodes at least partially overlap the graphene layer, and
   a potential difference between the third electrode and the fourth electrode can be varied without changing a frequency of light emitted across the active laser region; and wherein each electrode of the first and second pair of electrodes is on a same side of the semiconductor substrate.

10. The laser diode of claim 9 wherein an optical mode of a laser cavity of the laser diode overlaps with the layer of graphene.

11. The laser diode of claim 9 comprising a first voltage source to apply a variable potential difference between the third electrode and the fourth electrode so as to modulate output laser light by varying a voltage bias between a face of the graphene layer that faces the semiconductor substrate and a face of the graphene layer that faces the active laser region.

12. The laser diode of claim 9 comprising a second voltage source to apply a potential difference between the first electrode and the second electrode so as to pump the active laser region.

13. The laser diode of claim 9 wherein the third electrode and the fourth electrode are both on a first side of the active laser region.

14. The laser diode of claim 13 further comprising a fifth electrode and a sixth electrode on a second side of the active laser region wherein the fifth electrode contacts the second doped semiconductor layer of the active laser region and the sixth electrode has an electrically conductive connection to at least one of the semiconductor substrate and the graphene layer.

15. The laser diode of claim 9 wherein either the third electrode, or the fourth electrode directly contacts the layer of graphene.

* * * * *